(12) United States Patent
Yun

(10) Patent No.: US 8,399,993 B2
(45) Date of Patent: Mar. 19, 2013

(54) EMBEDDED PACKAGE AND METHOD FOR MANUFACTURING THE SAME

(75) Inventor: Yeo Song Yun, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/097,241

(22) Filed: Apr. 29, 2011

(65) Prior Publication Data

US 2012/0056319 A1    Mar. 8, 2012

(30) Foreign Application Priority Data

Sep. 3, 2010    (KR) .................. 10-2010-0086430

(51) Int. Cl.
*H01L 23/52*    (2006.01)
*H01L 23/48*    (2006.01)
*H01L 23/02*    (2006.01)
*H01L 23/26*    (2006.01)
*H01L 23/488*    (2006.01)

(52) U.S. Cl. ........ 257/777; 257/779; 257/737; 257/686; 257/E27.137; 257/E27.144; 257/E23.023; 257/E23.021

(58) Field of Classification Search .................. 257/777, 257/779, 737, 686, E27.137, E27.144, E23.023, 257/E23.021

See application file for complete search history.

(56) References Cited

U.S. PATENT DOCUMENTS

| 5,894,165 | A | * | 4/1999 | Ma et al. ................. 257/666 |
| 6,509,631 | B2 | * | 1/2003 | Toyosawa ................. 257/668 |
| 6,555,917 | B1 | * | 4/2003 | Heo ................. 257/777 |
| 7,017,421 | B2 | * | 3/2006 | Kehlenbach ................. 73/800 |
| 7,385,282 | B2 | * | 6/2008 | Shen ................. 257/686 |
| 7,807,512 | B2 | * | 10/2010 | Lee et al. ................. 438/127 |
| 7,847,383 | B2 | * | 12/2010 | So et al. ................. 257/685 |
| 2006/0063312 | A1 | * | 3/2006 | Kurita ................. 438/127 |
| 2007/0012655 | A1 | | 1/2007 | Kwon et al. |
| 2009/0091022 | A1 | | 4/2009 | Meyer et al. |

FOREIGN PATENT DOCUMENTS

KR        100629498  B1    9/2006
KR     1020100002711  A    1/2010

* cited by examiner

*Primary Examiner* — Luan C Thai
(74) *Attorney, Agent, or Firm* — William Park & Associates Ltd.

(57) ABSTRACT

An embedded package includes a first semiconductor chip having a first conductive line which has a first sunken area, a second semiconductor chip having a second conductive line which has a second sunken area, wherein the first semiconductor chip and the second semiconductor chip are arranged facing each other, and wherein the first sunken area and the second sunken area are arranged facing each other, a core layer surrounding the first semiconductor chip and the second semiconductor chip, wherein the core layer has a first circuit pattern coupled to an external terminal; and a bump formed in the first and second sunken areas, wherein the bump is coupled to the first circuit pattern.

12 Claims, 7 Drawing Sheets

EMBEDDED PACKAGE AND METHOD FOR MANUFACTURING THE SAME

CROSS-REFERENCE TO RELATED APPLICATIONS

The present application claims priority to Korean patent application number 10-2010-86430 filed on Sep. 3, 2010, which is incorporated herein by reference in its entirety.

BACKGROUND OF THE INVENTION

The present invention relates to an embedded package and a method for manufacturing the same.

As a space in which a semiconductor package is to be mounted gradually decreases with the trend of portable electronic appliances toward miniaturization and high capacity, research for increasing mounting efficiency is being continuously conducted. In order to increase mounting efficiency, a semiconductor package is may be made light, slim, compact and miniature. In an attempt therefor, an embedded package, in which chips are disposed not on the surface of a substrate but in the substrate, has been suggested in the art.

In order to realize high capacity and miniaturization of an embedded package, the number of chips which are embedded in a substrate may increase over 2, and the chips may be vertically arranged. However, if the number of chips which are vertically arranged increases, the number of layers of circuit patterns for electrically connecting the chips with an outside increases in proportion to the number of chips, which may lead to an increase in the thickness of the embedded package. Consequently, a problem is caused in that the embedded package becomes thick.

BRIEF SUMMARY OF THE INVENTION

Embodiments of the present invention are directed to an embedded package which has a reduced thickness and a method for manufacturing the same.

In an exemplary embodiment of the present invention, an embedded package includes a first semiconductor chip having a first conductive line which has a first sunken area, a second semiconductor chip having a second conductive line which has a second sunken area, wherein the first semiconductor chip and the second semiconductor chip are arranged facing each other, and wherein the first sunken area and the second sunken area are is arranged facing each other, a core layer surrounding the first semiconductor chip and the second semiconductor chip, wherein the core layer has a first circuit pattern coupled to an external terminal, and a bump formed in the first and second sunken areas, wherein the bump is coupled to the first circuit pattern.

In another exemplary embodiment of the present invention, a method for manufacturing an embedded package includes preparing first and second semiconductor chips wherein each of the first and second semiconductor chips has a sunken area at a side surface, forming a first cavity by etching a third surface of a first sub core layer, wherein the first sub core layer has a first surface and a third surface, wherein a first circuit pattern is formed over the third surface, and a second circuit pattern is formed over the first surface, mounting the first semiconductor chip in the first cavity such that a first bump of the first semiconductor chip is exposed on the third surface of the first sub core layer and electrically connected with the first circuit patterns, forming a second cavity by etching a fourth surface of a second sub core layer, wherein the second sub core layer has a second surface and a fourth surface, wherein a third circuit pattern is formed over the second surface, mounting the second semiconductor chip in the second cavity such that a second bump of the second semiconductor chip is exposed on the fourth surface of the second sub core layer and electrically connected with the first circuit patterns; attaching the second sub core layer mounted with the second semiconductor chip onto the first sub core layer mounted with the first semiconductor chip such that the first bump of the first semiconductor chip and the second bump of the second semiconductor chip are connected with each other; and forming a first via through the second circuit pattern and the first sub core layer such that the first via electrically connects the second circuit pattern and the first circuit pattern with each other, and a second via through the third circuit pattern and the second sub core layer such that the second via electrically connects the third circuit pattern and the first circuit pattern with each other.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
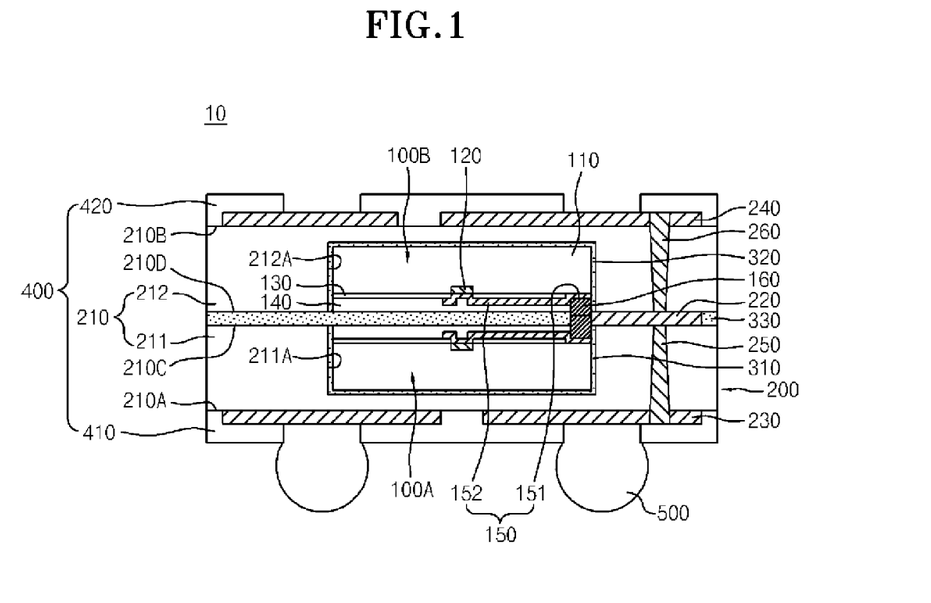
FIG. 1 is a cross-sectional view illustrating an embedded package in accordance with an exemplary embodiment of the present invention.
Figure 2:
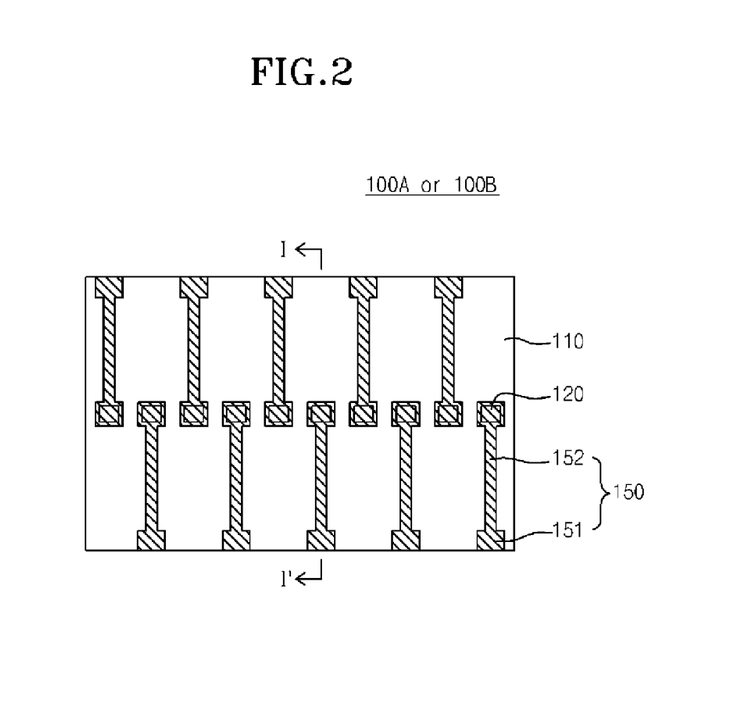
FIG. 2 is a plan view illustrating each of first and second semiconductor chips shown in FIG. 1.
Figure 3:
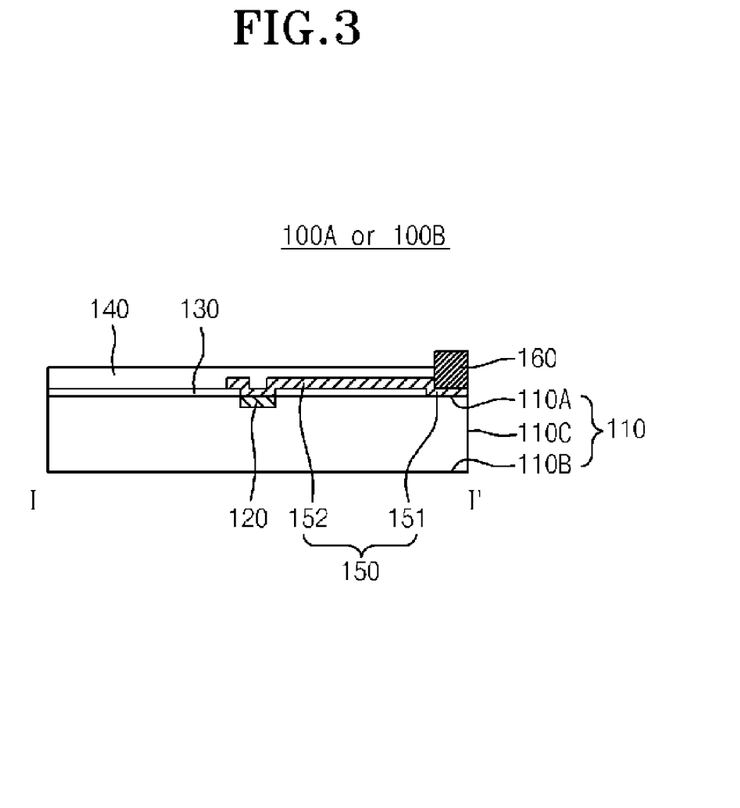
FIG. 3 is a cross-sectional view taken along the line I-I' of FIG. 2.

FIG. 1 is a cross-sectional view illustrating an embedded package in accordance with an exemplary embodiment of the present invention, FIG. 2 is a plan view illustrating each of first and second semiconductor chips shown in FIG. 1, and FIG. 3 is a cross-sectional view taken along the line I-I' of FIG. 2.

Referring to FIG. 1, an embedded package 10 in accordance with an exemplary embodiment of the present invention includes first and second semiconductor chips 100A and 100B and a substrate 200. Besides, the embedded package 10 further includes first, second and third adhesive member 310, 320 and 330, solder resists 400, and an external connection terminal 500.

Referring to FIGS. 2 and 3, each of the first semiconductor chip 100A and the second semiconductor chip 100B includes a semiconductor chip body 110 and a conductive element, e.g., a bump 160. Besides, each of the first semiconductor chip 100A and the second semiconductor chip 100B further includes a bonding pad 120, first and second insulation layers 130 and 140, and a conductive line, e.g., a redistribution line 150.

The semiconductor chip body 110 has a first surface 110A, a second surface 110B, and a side surface 110C which connects the first surface 110A and the second surface 110B with each other.

The semiconductor chip body 110 may include a circuit unit (not shown). The circuit unit includes, for example, a data storage section for storing data and a data processing section for processing data.

The bump 160 is disposed on the first surface 110A of the semiconductor chip body 110, and exposed on the side surface of the semiconductor chip body 110. The bump 160 may contain any one of a conductive epoxy, Ag, Cu, Sn, Au, and an Sn-based alloy.

Referring to FIG. 2, the bonding pads 120 are disposed on the first surface 110A of the semiconductor chip body 110 and may be electrically connected with the circuit unit. According to the exemplary embodiment, the bonding pads 120 are disposed along the center portion of the first surface 110A of the semiconductor chip body 110. The bonding pads 120 may contain aluminum.

Referring to FIG. 3, the first insulation layer 130 is formed on the first surface 110A of the semiconductor chip body 110 such that the bonding pad 120 is exposed. Here, the first insulation layer 130 may be formed in such a way as to expose an edge portion of the first surface 110A of the semiconductor chip body 110, and thus the height of the embedded package 10 may not increase due to the presence of the bump 160. The first insulation layer 130 includes a polymer layer, and may contain polyimide.

The redistribution line 150 is formed over the exposed portion of the first surface 110A of the semiconductor chip body 110 and over a portion of the first insulation layer 130 and the bonding pads 120. In order to form the redistribution line 150, copper may be used, and also any one of silver, gold, nickel, palladium, platinum, and an alloy thereof may be used.

The redistribution line 150 includes a bump pad 151 and a connection line 152. The bump pad 151 may be formed on the edge portion of the first surface 110A of the semiconductor chip body 110. In the exemplary embodiment, the bump pad 151 is formed on a portion of the first surface 110A of the semiconductor chip body 110, which is exposed through the first insulation layer 130. The connection line 152 is formed on the bonding pad 120 and a portion of the first insulation layer 130, and electrically connect the bonding pad 120 and the bump pad 151. The connection line 152 and the bump pad 151 may be formed integrally with each other.

The second insulation layer 140 is formed on the first insulation layer 130 and the connection line 152 in such a way as to expose the bump pad 151. The bump 160 is mounted on the bump pad 151 which is exposed through the second insulation layer 140.

The first semiconductor chip 100A and the second semiconductor chip 100B are vertically stacked such that their bumps 160 are connected with each other.

Although it was described in the exemplary embodiment of the invention that the bonding pad 120 is disposed along the center portion of the first surface 110A of the semiconductor chip body 110, it is to be noted that the positions of the bonding pad 120 is not limited to such. For example, the bonding pad 120 may be disposed on the first surface 110A of the semiconductor chip body 110 in such a way as to be exposed on the side surface 110C of the semiconductor chip body 110. In this case, the redistribution line 150 and the second insulation layer 140 may be omitted.

Referring back to FIG. 1, the substrate 200 includes a core layer 210, a first, a second and a third circuit pattern 220, 230 and 240, and first and second vias 250 and 260.

The core layer 210 may be formed to surround the stacked first and second semiconductor chips 100A and 100B, and may have a rectangular hexahedral shape. According to an example, the core layer 210 having a rectangular hexahedral shape. The core layer 210 may contain a reinforcing base material and a resin, for example, such as glass fiber and epoxy, paper and phenol resin, and paper and epoxy resin.

In the exemplary embodiment, the core layer 210 includes a first sub core layer 211 and a second sub core layer 212. The first sub core layer 211 has a first surface 210A and a third surface 210C. The first sub core layer 211 has a first cavity 211A on the third surface 210C, in which the first semiconductor chip 100A is arranged.

The second sub core layer 212 has a second surface 210B and a fourth surface 210D which is attached to the third surface 210C of the first sub core layer 211. The second sub core layer 212 has a second cavity 212A on the fourth surface 210D, in which the second semiconductor chip 100B is arranged.

The first circuit pattern 220 is disposed in the core layer 210 and electrically connected to the bump 160. In the exemplary embodiment, the first circuit pattern 220 is disposed between the first sub core layer 211 and the second sub core layer 212.

The second circuit pattern 230 is disposed on the first surface 210A of the core layer 210, and the third circuit pattern 240 is disposed on the second surface 210B of the core layer 210.

The first via 250 is disposed in the core layer 210 and electrically connect the first circuit pattern 220 and the second circuit pattern 230. In the exemplary embodiment, the first via 250 passes through the second circuit pattern 230 and the first sub core layer 211, and electrically connects the first circuit pattern 220 and the second circuit pattern 230. The second via 260 is disposed in the core layer 210, and electrically connects the first circuit pattern 220 and the third circuit pattern 240. In the exemplary embodiment, the second vias 260 passes through the third circuit pattern 240 and the second sub core layer 212, and electrically connects the first circuit pattern 220 and the third circuit pattern 240. The first and second vias 250 and 260 may contain any one of copper, aluminum, gold and silver.

The first semiconductor chip 100A is attached to the first cavity 211A with the first adhesive member 310, and the second semiconductor chip 100B is attached to the second cavity 212A with the second adhesive member 320. Each of the first and second adhesive members 310 and 320 may include any one of a double-sided adhesive tape and an adhesive paste.

By setting the width of the first and second cavities 211A and 212A to be slightly larger than the width of the first and second semiconductor chips 100A and 100B, the first and second semiconductor chips 100A and 100B may be arranged in the first and second cavities 211A and 212A without the first and second adhesive members 310 and 320. That is, by setting the width of the first and second cavities 211A and 212A to substantially correspond to the first and second semiconductor chips 100A and 100B, the use of the first and second adhesive members 310 and 320 may be omitted.

The third adhesive member 330 functions to attach the first sub core layer 211 and the second sub core layer 212 to each other and the first semiconductor chip 100A and the second semiconductor chip 100B to each other. The third adhesive member 330 may include a double-sided adhesive tape or an adhesive paste.

The redistribution line 150 includes a bump pad 151 and a connection line 152. The bump pad 151 may be formed on the edge portion of the first surface 110A of the semiconductor chip body 110. In the exemplary embodiment, the bump pad 151 is formed on a portion of the first surface 110A of the semiconductor chip body 110, which is exposed through the first insulation layer 130. The connection line 152 is formed on the bonding pad 120 and a portion of the first insulation layer 130, and electrically connect the bonding pad 120 and the bump pad 151. The connection line 152 and the bump pad 151 may be formed integrally with each other.

The second insulation layer 140 is formed on the first insulation layer 130 and the connection line 152 in such a way as to expose the bump pad 151. The bump 160 is mounted on the bump pad 151 which is exposed through the second insulation layer 140.

The solder resists 400 include a first solder resist 410 and a second solder resist 420. The first solder resist 410 is formed on the first surface 210A of the core layer 210 in such a way as to expose a portion of the second circuit pattern 230, and the second solder resist 420 is formed on the second surface 210B of the core layer 210 in such a way as to expose a portion of the third circuit patterns 240.

The external connection terminal 500 is disposed on the portion of the second circuit pattern 230 which is exposed through the first solder resist 410. The external connection terminal 500 may include solder ball.

A method for manufacturing an embedded package according to an exemplary embodiment of the present invention will be described below.

FIGS. 4 through 11 are cross-sectional views illustrating the processes of a method for manufacturing an embedded package in accordance with another exemplary embodiment of the present invention.

First, first and second semiconductor chips 100A and 100B are prepared.

The first and second semiconductor chips 100A and 100B may have the same construction as the first and second semiconductor chips 100A and 100B which are described above with reference to FIGS. 2 and 3.

Figure 4:
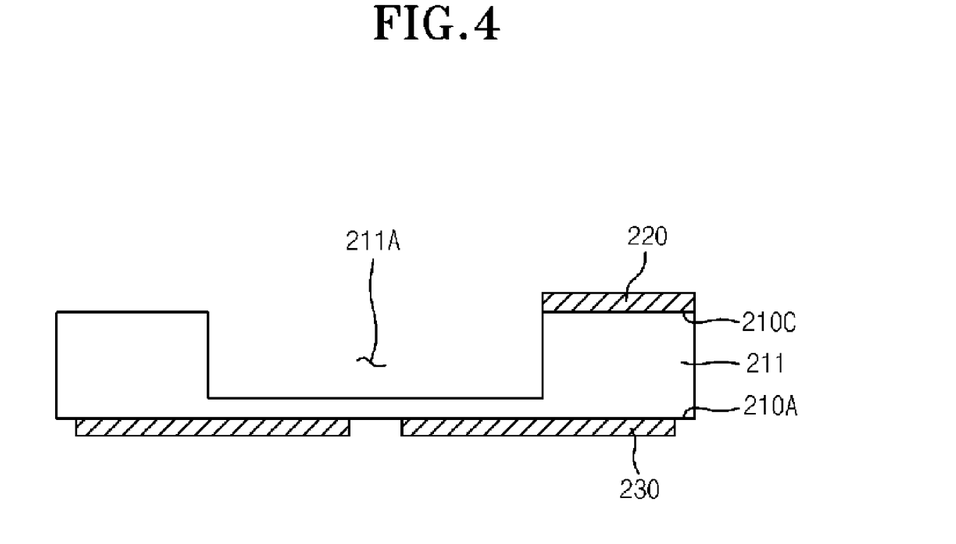
FIGS. 4 through 11 are cross-sectional views illustrating processes of a method for manufacturing an embedded package in accordance with another exemplary embodiment of the present invention.

Referring to FIG. 4, by etching a portion of a third surface 210C of a first sub core layer 211, a first cavity 211A is formed.

Figure 5:
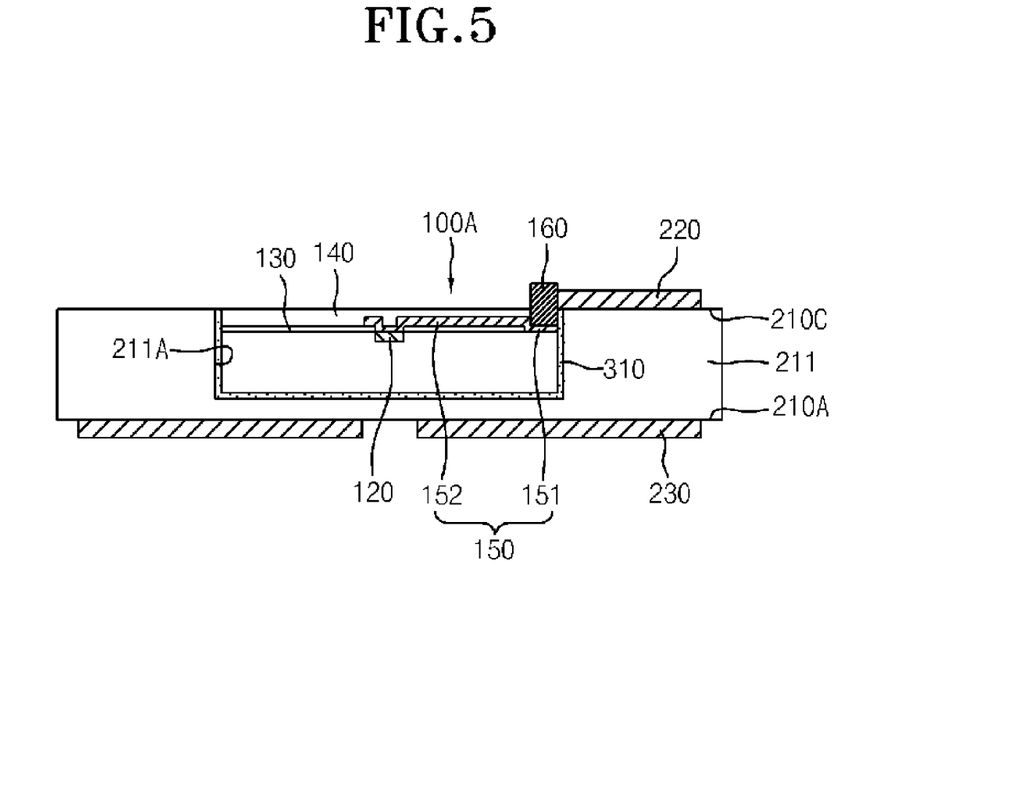

Referring to FIG. 5, the first semiconductor chip 100A is arranged in the first cavity 211A in such a manner that the bump 160 of the first semiconductor chip 100A is connected with the first circuit pattern 220 exposing a portion to contact with another bump.

In the another exemplary embodiment, the first semiconductor chip 100A is attached to the surfaces of the first cavity 211A of the first sub core layer 211 by a first adhesive member 310. The first adhesive member 310 may include a double-sided adhesive tape or an adhesive paste.

On the other hand, by forming the first cavity 211A to have a width slightly larger than the width of the first semiconductor chip 100A, the first semiconductor chip 100A may be arranged in the first cavity 211A without the first adhesive member 310. In this case, the use of the first adhesive member 310 may be omitted.

Figure 6:
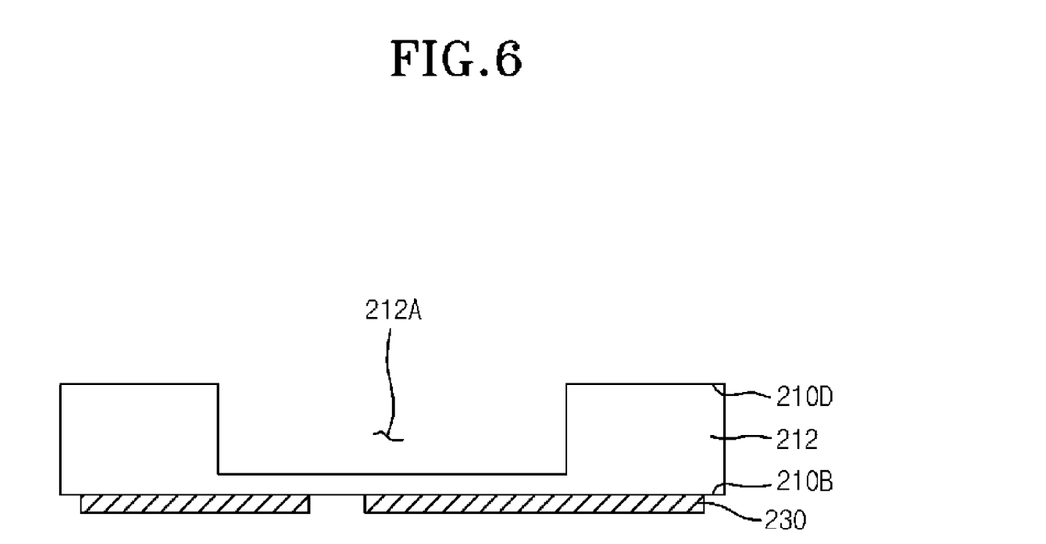

Referring to FIG. 6, by etching a portion of a fourth surface 210D of a second sub core layer 212, a second cavity 212A is formed.

Figure 7:
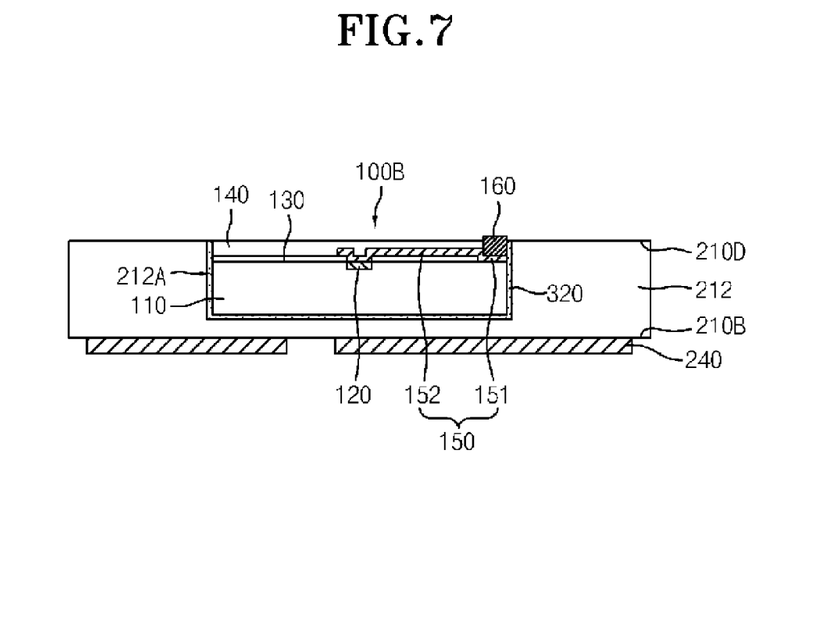

Referring to FIG. 7, the second semiconductor chip 100B is arranged in the second cavity 212A in such a manner that the bump 160 of the second semiconductor chip 100B exposes a portion to contact with another bump.

In the exemplary embodiment, the second semiconductor chip 100B is attached to the surface of the second cavity 212A of the second sub core layer 212 with a second adhesive member 320. The second adhesive member 320 may include a double-sided adhesive tape or an adhesive paste.

On the other hand, by forming the second cavity 212A to have a width slightly larger than the width of the second semiconductor chip 100b, the second semiconductor chip 100B may be arranged in the second cavity 212A without the second adhesive member 320. In this case, the use of the second adhesive member 320 may be omitted.

Figure 8:
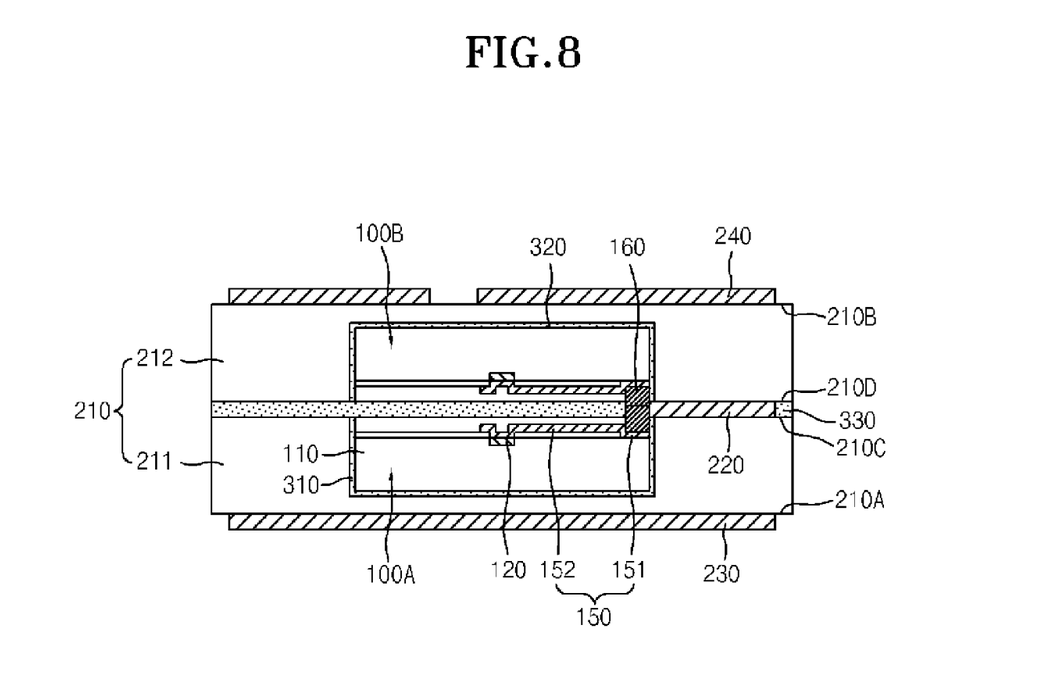

Referring to FIG. 8, the second sub core layer 212 mounted with the second semiconductor chip 100B is attached onto the first sub core layer 211 mounted with the first semiconductor chip 100A with a third adhesive member 330 such that the bump 160 of the first semiconductor chip 100A and the bump 160 of the second semiconductor chip 160 are connected with each other. The first sub core layer 211 and the second sub core layer 212, which are attached to each other with the third adhesive member 330, constitute a core layer 210. The adhesive member 330 may include a double-sided adhesive tape or an adhesive paste.

In addition, in order to ensure stable coupling of the bumps 160 of the first and second semiconductor chips 100A and 100B with the first circuit pattern 220, an annealing process for reflowing the bumps 160 may be additionally performed. On the other hand, a process may be conducted within a temperature range which allows the bumps 160 to be melted, without separately performing an annealing process, such that the bumps 160 can reflow while performing the process.

Figure 9:
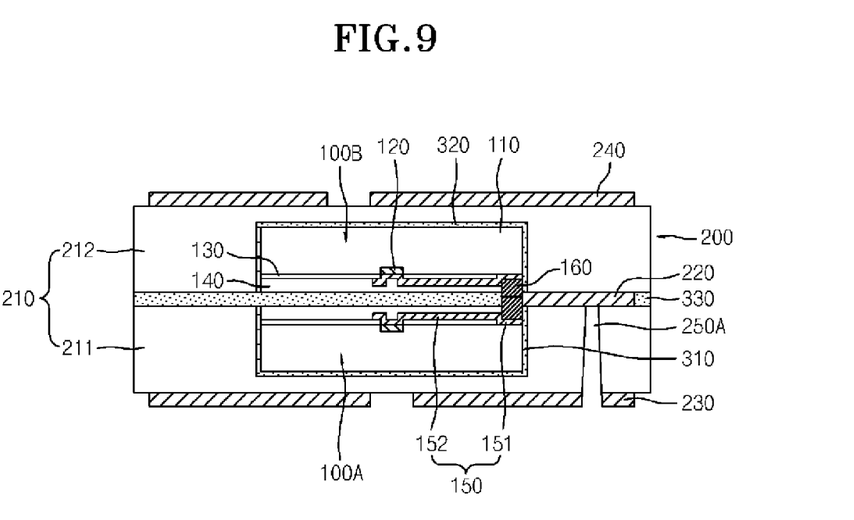
Figure 10:
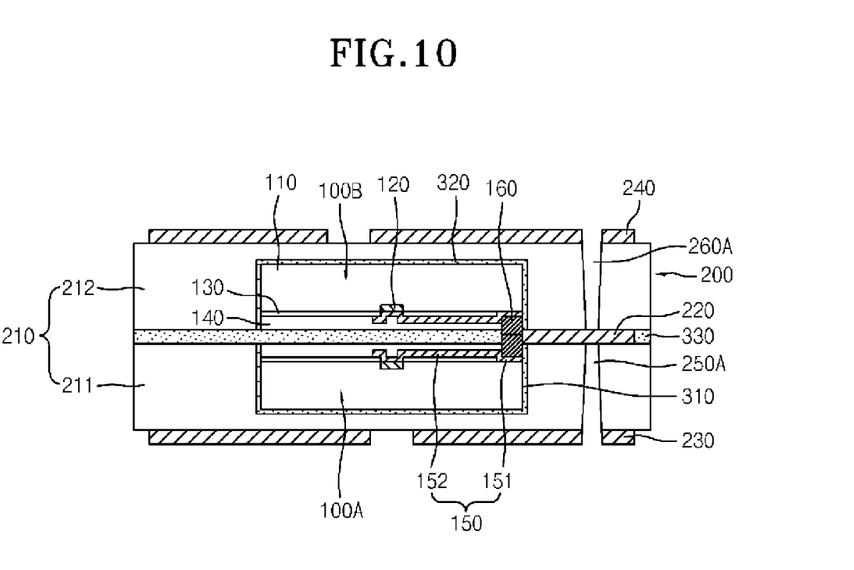

Referring to FIGS. 9 and 10, a first via hole 250A is formed through the second circuit pattern 230 and the first sub core layer 211 in such a way as to expose the first circuit patterns 220, and a second via hole 260A is formed through the third circuit patterns 240 and the second sub core layer 212 in such a way as to expose the first circuit pattern 220. The forming of the first and second via holes 250A and 260A may be implemented through any one of a photolithographic process, a drilling process and a laser drilling process.

Figure 11:
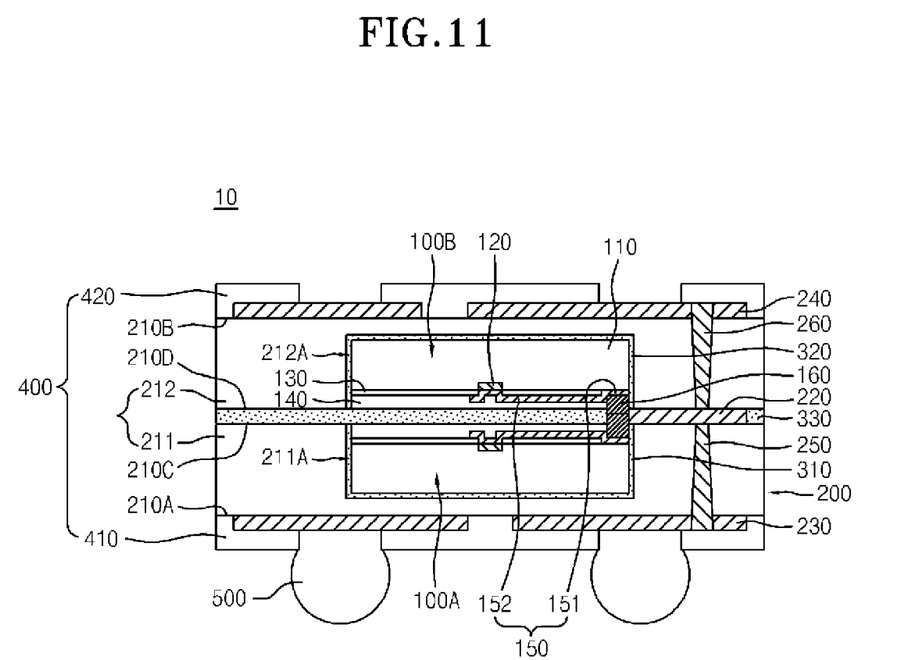

Referring to FIG. 11, by filling a conductive material in the first via hole 250A and the second via hole 260A, a first via 250, which electrically connects the first circuit pattern 220 with the second circuit pattern 230, is formed. Also, a second via 260, which electrically connects the first circuit pattern 220 with the third circuit pattern 240, is formed. Forming of the first and second vias 250 and 260 may be implemented through a plating process or a deposition process. As the conductive material for forming the first and second vias 250 and 260, any one of copper, aluminum, gold and silver may be used.

A first solder resist 410 is formed on the first surface 210A of the core layer 210 on which the second circuit pattern 230 is formed, in such a way as to expose a portion of the second circuit pattern 230, and a second solder resist 420 is formed on the second surface 210B of the core layer 210 on which the third circuit pattern 240 is formed, in such a way as to expose a portion of the third circuit pattern 240.

Thereafter, an external connection terminal 500 is mounted to the exposed portion of the second circuit pattern 230. The external connection terminal 500 include a solder ball.

Figure 12:
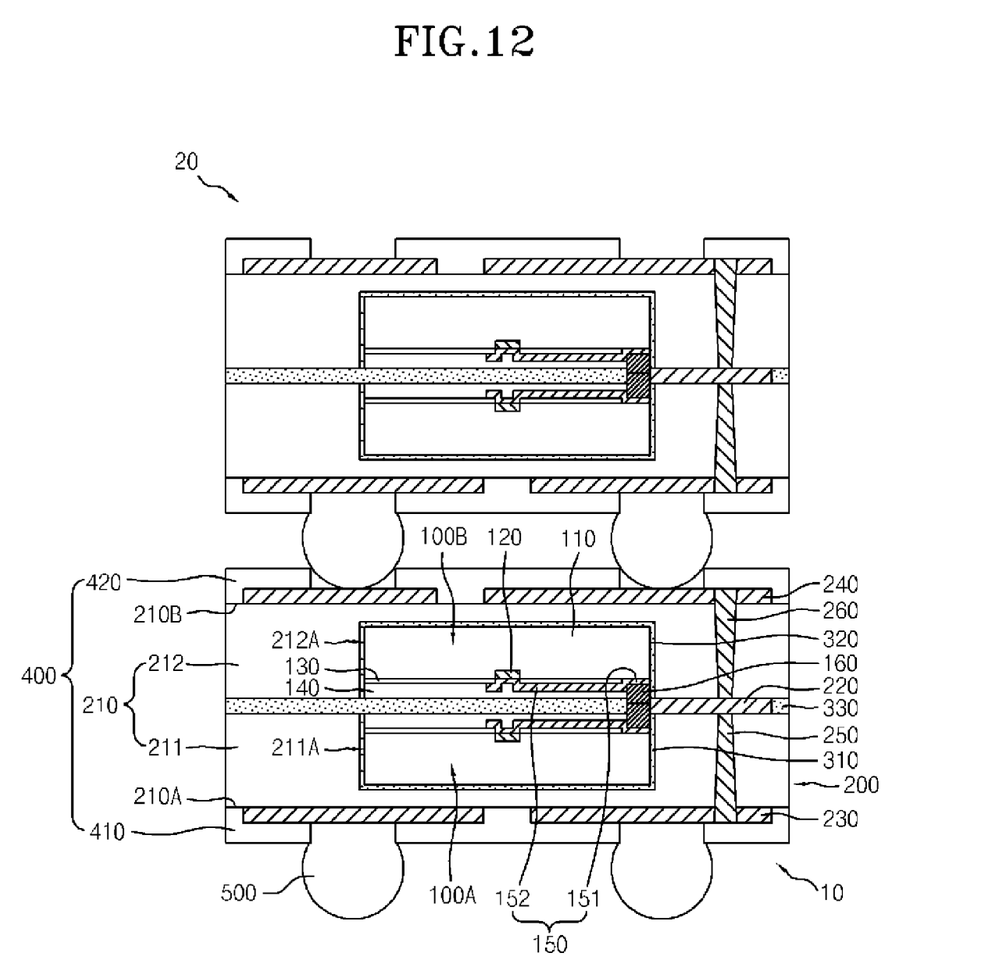
FIG. 12 is a cross-sectional view illustrating a stacked semiconductor package using an embedded package in accordance with another exemplary embodiment of the present invention.

FIG. 12 is a cross-sectional view illustrating a stacked semiconductor package using an embedded package in accordance with another exemplary embodiment of the present invention.

Referring to FIG. 12, after the embedded package 10 according to the exemplary embodiment of the invention is manufactured, another semiconductor package 20 is stacked on the exposed portions of the third circuit patterns 240 of the embedded package 10. In the exemplary embodiment, the semiconductor package 20 which is stacked over the embedded package 10 may have the same shape as the embedded package 10.

Although it was illustrated and explained in the exemplary embodiment that the semiconductor package 20 which is stacked over the embedded package 10 has the same shape as the embedded package 10, it is to be noted that the shape of the semiconductor package 20 is not specifically limited.

As is apparent from the above description, in the invention, since an increase in the thickness of an embedded package due to the presence of circuit patterns is suppressed, a thin embedded package can be realized. Also, because the length of a signal path for connecting semiconductor chips with an outside decreases, the electrical characteristics of the embedded package can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. An embedded package comprising:
 a first semiconductor chip having a first conductive line which has a first sunken area;
 a second semiconductor chip having a second conductive line which has a second sunken area, wherein the second semiconductor chip is stacked on the first semiconductor chip such that the first sunken area and the second sunken area are arranged meeting each other;
 a bump formed in the first and the second sunken areas, and coupled to all of the first and the second conductive line; and
 a core layer surrounding the first semiconductor chip and the second semiconductor chip including the bump, wherein the core layer has a first circuit pattern coupled to an external terminal and is directly coupled to the first circuit pattern.

2. The embedded package according to claim 1, wherein the first and second conductive lines are redistribution lines.

3. The embedded package according to claim 2,
 wherein each of the first semiconductor chip and the second semiconductor chip further comprises a bonding pad which is disposed over a surface of the semiconductor chip, and the redistribution line which is disposed over the surface of the semiconductor chip and have an end connected to the bonding pad and the other end is exposed at a side surface of the semiconductor chip, and
 wherein the bump is mounted to the other end of the redistribution line.

4. The embedded package according to claim 3, wherein the redistribution lines comprise:
 a bump pad exposed on a side surface of the first and second semiconductor chips; and
 a connection line electrically connecting the bonding pad with the bump pad.

5. The embedded package according to claim 4, wherein each of the first semiconductor chip and the second semiconductor chip further comprises a first insulation layer which is formed on a surface of the semiconductor chip in such a way as to expose the bonding pad, and a second insulation layer which is formed on the first insulation layer including the redistribution line in such a way as to expose the bump pad.

6. The embedded package according to claim 1, wherein the core layer comprises:
 a first sub core layer having a first surface and a third surface, wherein the third surface includes a first cavity in which the first semiconductor chip is mounted; and
 a second sub core layer having a second surface and a fourth surface attached to the third surface of the first sub core layer, wherein the fourth surface includes a second cavity in which the second semiconductor chip is mounted.

7. The embedded package according to claim 6, further comprising:
 a first adhesive member with which the first semiconductor chip is attached to the first cavity; and
 a second adhesive member with which the second semiconductor chip is attached to the second cavity.

8. The embedded package according to claim 6,
 wherein the first circuit pattern is disposed between the first sub core layer and the second sub core layer.

9. The embedded package according to claim 6,
 further comprises a third adhesive member with which the first sub core layer and the second sub core layer are attached to each other, and the first semiconductor chip and the second semiconductor chip to each other.

10. The embedded package according to claim 1, further comprising:
 a first solder resist formed on a first surface of the core layer in such a way as to expose a portion of a second circuit pattern; and
 a second solder resist formed on second surface of the core layer in such a way as to expose a portion of a third circuit pattern.

11. The embedded package according to claim 10, further comprising:
 a first via formed in the first sub core layer, which electrically connects the first circuit pattern with the second circuit pattern; and
 a second via formed in the second sub core layer, which electrically connects the first circuit pattern with the third circuit pattern.

12. The embedded package according to claim 10, further comprising:
 an external connection terminal mounted to the exposed portion of the second circuit pattern.

* * * * *